US 8,257,506 B2

(12) United States Patent
Dubreuil et al.

(10) Patent No.: US 8,257,506 B2
(45) Date of Patent: Sep. 4, 2012

(54) PULSED CHEMICAL DISPENSE SYSTEM

(75) Inventors: Olivier Dubreuil, Grenoble (FR);
Srdjan Kordic, Biviers (FR); Theodore Carambeeris, Tempe, AZ (US)

(73) Assignee: NXP B.V., Eindhoven (NL)

( * ) Notice: Subject to any disclaimer, the term of this patent is extended or adjusted under 35 U.S.C. 154(b) by 432 days.

(21) Appl. No.: 12/162,624

(22) PCT Filed: Feb. 1, 2007

(86) PCT No.: PCT/EP2007/050965
§ 371 (c)(1),
(2), (4) Date: Jul. 30, 2008

(87) PCT Pub. No.: WO2007/088182
PCT Pub. Date: Aug. 9, 2007

(65) Prior Publication Data
US 2009/0007938 A1    Jan. 8, 2009

(30) Foreign Application Priority Data
Feb. 1, 2006  (EP) ................................. 06300098

(51) Int. Cl.
*B08B 7/00* (2006.01)
*B08B 7/04* (2006.01)
*B08B 3/00* (2006.01)
*B08B 3/04* (2006.01)

(52) U.S. Cl. ............. 134/18; 134/10; 134/42; 134/56 R; 134/94.1; 134/104.2

(58) Field of Classification Search ........................ None
See application file for complete search history.

(56) References Cited

U.S. PATENT DOCUMENTS

| 5,570,154 | A | * | 10/1996 | Kurimoto et al. | 396/568 |
| 5,990,060 | A | * | 11/1999 | Ohmi et al. | 510/175 |
| 6,634,806 | B2 | * | 10/2003 | Toshima et al. | 396/611 |
| 6,927,198 | B2 | | 8/2005 | Zhang et al. | |
| 7,249,992 | B2 | * | 7/2007 | Kalenian et al. | 451/11 |
| 2001/0001407 | A1 | | 5/2001 | You et al. | |
| 2003/0000550 | A1 | * | 1/2003 | Middendorf et al. | 134/6 |
| 2003/0196683 | A1 | | 10/2003 | Izumi et al. | |
| 2005/0009362 | A1 | | 1/2005 | Nishida et al. | |

FOREIGN PATENT DOCUMENTS

| JP | 01201923 A | 8/1989 |
| JP | 02-218557 A | 8/1990 |
| JP | 2000-343415 A | 12/2000 |
| JP | 2003-282519 A | 3/2003 |
| JP | 2006-012934 A | 12/2006 |
| WO | 2006100953 A | 9/2006 |

* cited by examiner

Primary Examiner — Michael Kornakov
Assistant Examiner — Nicole Blan

(57) ABSTRACT

The present invention relates to a cost saving liquid-treatment unit (100). According to the invention, a control unit (152), which is connected to an input port of a control valve (118, 120, 122), is adapted to set, in dependence on the evaporation rate of a treatment liquid on the substrate at the given or desired temperature of the substrate and/or at the given or desired pressure of a gaseous ambient atmosphere at the substrate, a number of dispense pulses to be applied to the substrate for the liquid treatment, a respective pulse duration of individual dispense pulses, and respective dispense-interruption time spans between the individual dispense pulses. This way, the use of treatment liquid is reduced to a minimum amount, thus reducing costs for providing and cleaning treatment liquid.

20 Claims, 4 Drawing Sheets

PULSED CHEMICAL DISPENSE SYSTEM

The present invention relates to a liquid-treatment unit for treating a substrate, a chemical-mechanical planarization (CMP) apparatus, and a method for liquid treatment of a substrate.

Chemical-mechanical planarization is a technique that enables a global planarization of both dielectric and metal layers of interconnect structures in integrated-circuit devices. Chemical-mechanical planarization is also known under the name chemical-mechanical polishing and, in short, as CMP.

The CMP process is performed by mounting a wafer onto a carrier, with the substrate surface to be planarized facing down. The carrier is then pressed against a platen, which contains a planarization pad. A slurry, which contains an abrasive, is dripped onto pad, or fed through the pad. The platen and the carrier are both rotated independent from each other. Some CMP tools employ a linear, others an orbital movement of the planarization pad.

CMP is a key enabling technology for the production of sub-micron integrated-circuit devices, and has been developed over the past 20 years. However, various aspects of the CMP process are still under continuous research and development. Basically, each CMP application requires its own slurry composition and chemical treatment of the substrate before and after the CMP process. For instance, individual CMP processes were developed for damascene aluminum interconnects, for tungsten, and for copper interconnects. Individual CMP processes were also developed for various dielectric materials such as silicon dioxide and, more recently, low-k dielectrics.

The development of CMP processes has been accompanied by the development of CMP equipment. Beside the core functionalities provided by CMP polishing tools, and by CMP consumables, such as polishing pads, slurries, increasing attention has also be paid to cleaning issues in CMP. For CMP is an inherently dirty process that can introduce defects to a wafer. Residual slurry can introduce foreign particles, metal contaminants, and chemicals, which are all detrimental for further processing steps of wafer or chip fabrication. The main goal of post-CMP cleaning steps is to provide a wafer that is free of slurry particles or organic residues or metal ions. Post-polish cleaning techniques have been developed so that wafers are not contaminated after CMP, when they are returned to the cleanroom for further processing.

Further known processing steps in the framework of CMP that involve the application of treatment liquids include the passivation of surfaces, for instance a passivation of copper surfaces to prevent an oxidation or corrosion of copper. This step is typically applied at an input station, and an output station of the CMP apparatus. The application of treatment liquids is also known between polishing platens in order to prevent a particle agglomeration, corrosion, or a drying of the wafer in case a polishing tool becomes non-operational.

U.S. Pat. No. 6,927,198 B2 describes a method and apparatus for cleaning semiconductor substrates after polishing of a copper film. According to the method disclosed in this document, a semiconductor substrate with a polished copper layer is placed in a scrubber. The substrate is scrubbed on both sides simultaneously. During this cleaning process, a treatment liquid in the form of a cleaning solution is applied to both substrate sides in order to aid and/or effectuate the removal of contaminants. The cleaning solution is a mixture of chemicals in deionized water. After scrubbing, the substrate is placed in a liquid-treatment unit in the form of a rinse, spin and dry station for additional cleaning, before transporting it to an output station. There, the substrate is placed into a cassette for transfer into a storage or into another cleaning or processing system.

As is well known to those of ordinary skill in the art, wafers exposed to air for even a short time before liquid treatment, e.g., while waiting to be unloaded, are much more difficult and sometimes impossible to clean. Also, immediate removal of metal-polish slurries is considered critical, because such slurries can continue to react and remove material from the substrate surface even after polishing has ceased. Therefore, prior-art liquid-treatment units like that disclosed in U.S. Pat. No. 6,927,198 B2 provide a continuous flow of treatment liquid in order to ensure that the substrate surface treated does not run dry.

Liquid-treatment processes of the substrate surface in the context of a CMP process therefore require a large amount of treatment liquid. Since consumption of treatment liquids involves high costs, not only for providing the treatment liquids, but also for the disposal of used and contaminated treatment liquids, the CMP processing costs are high, and fabricated integrated-circuit devices in turn are expensive.

It is preferred to provide a liquid-treatment unit, in particular for a chemical-mechanical planarization apparatus that reduces the processing cost. It is a further object of the present invention to provide a liquid-treatment method that reduces the processing cost for liquid treatment of a substrate, particularly in the context of a chemical-mechanical planarization process.

According to a first aspect of the invention, liquid-treatment unit for treating a substrate is provided. The liquid-treatment unit comprises a reservoir for storing a treatment liquid;

a dispenser, which has an input port that is communicating with the reservoir, and an output port, and which is configured to dispense a treatment liquid received at the input port onto a substrate;

a control valve, which has a control input port and which is arranged in a liquid-communication path between the reservoir and the output port of the dispenser, and which is adapted to open or shut the liquid-communication path according to valve-control signals received at the control input port.

The liquid-treatment unit further comprises a control unit, which is connected to the control input port of the control valve, and which is adapted to set, in dependence on the evaporation rate of the treatment liquid on the substrate at the given or desired temperature of the substrate and/or at the given or desired pressure of the gaseous atmosphere, and/or the given or desired temperature and pressure of the fluid, a number of dispense pulses to be applied to the substrate for the liquid treatment, a respective pulse duration of individual dispense pulses, and respective dispense-interruption time spans between the individual dispense pulses; and generate and provide a sequence of valve-control signals to the control valve for opening and shutting the liquid communication path according to a dispense-pulse sequence with the set number of dispense pulses, the set respective dispense-pulse durations, and the set respective dispense-interruption time spans between individual dispense pulses.

The liquid-treatment unit of the first aspect of the invention allows a significant reduction of the consumption of treatment liquids. The term "treatment liquid" is meant to include all sorts of liquid treatment chemicals including solutions of different chemicals in deionized water. The present invention, however, is not concerned with dispensing slurry on to a polishing pad. Therefore, the term "treatment liquid" shall not be construed to include slurries used for the actual CMP steps.

It is to be noted that, while application references herein are mainly made to a preferred use of the invention in the field of CMP, use of the liquid-treatment unit of the first aspect of the invention shall not be construed as limited to CMP. The liquid-treatment unit can be used for any liquid treatment of a substrate.

Correspondingly, the term "liquid treatment" includes all sorts of treatment of a processed substrate with a treatment liquid. Particularly, in the framework of a CMP process the term "liquid treatment" includes the examples mentioned in the above description of the prior art, but not the actual CMP step, which is performed using a slurry.

The term "pulse" is used herein with the meaning of a single dispense impulse extending over a time span which is shorter than or, at maximum, equal the total time of providing the liquid treatment to a substrate surface. The term "pulse" is not used with the meaning of an impulse sequence.

A dispense-pulse sequence for liquid treatment may comprise one pulse or a plurality of pulses. In some applications, a single dispense pulse is usually enough. A typical example for this case is a passivation treatment of a Cu surface of an interconnect stack. The control unit thus sets the number of dispense pulses to 1 and determines the required duration of the single dispense pulse. However, in cases where the passivation layer generated by the liquid treatment needs to be regenerated, any higher number of dispense pulses can be applied.

In the liquid-treatment unit of the first aspect of the invention, a control valve is arranged in the liquid communication path between a reservoir containing the treatment liquid and a dispenser. The operation of the control valve is governed by a control unit. The control unit enables a pulsed delivery of the treatment liquid during a liquid treatment of the substrate in the context of a CMP process.

The treatment-liquid amount, which is provided with each dispense-pulse, depends on an evaporation rate of the treatment liquid on the substrate at a given or desired temperature of the substrate and/or a given or desired pressure of a gaseous ambient atmosphere, in which the substrate is stored during or after the liquid-treatment step. Note that the pressure dependence of the evaporation rate may not play a role for the device implementation, for instance if the ambient pressure is a known processing constant. Thus, one embodiment of the liquid-treatment unit makes use of the temperature alone for setting the treatment parameters. On the other hand, processing conditions may exist, where ambient pressure, not temperature, is in fact the decisive parameter. Thus, one embodiment of the liquid-treatment unit makes use of the ambient pressure alone for setting the treatment parameters. In other processing environments, however, both parameters will influence the setting of the treatment parameters.

Other parameters, which as such are known, may or may not influence the amount of treatment liquid required for achieving a particular treatment result of a single dispense pulse. The detailed parameters entering the required amount of treatment liquid depend on the particular purpose of the liquid treatment in general and the particular dispense pulse in particular. The purpose of the liquid treatment in general is also a basic criterion for a selection of the composition of the treatment liquid. Of course, a treatment liquid known as suitable for the particular purpose and the particular substrate surface to be treated must be chosen. In principle, each treatment liquid has its own characteristic dependence of an evaporation rate on temperature and pressure. The purpose of individual dispense pulses of a dispense-pulse sequence can be identical or different. For instance a first dispense pulse can serve to create a passivation layer on a metal surface, while following dispense pulses of the same sequence need only refresh that passivation layer. This difference in purpose may affect the amount of treatment liquid required for a respective dispense pulse, and therefore its duration. In the given example, a refreshing pulse usually needs a smaller amount of treatment liquid.

The control unit is configured to set parameters of a dispense-pulse sequence in dependence on given or desired temperature and/or ambient pressure values. In the following, the terms "given" and "desired" will be explained in more detail.

The "given" temperature or ambient pressure refers to a measurable quantity at the current or close-to-current point in time during the operation of the control unit. For instance, if a substrate is to be kept wet while waiting to be unloaded from a carrier after a CMP step, the current temperature of the substrate and the pressure of the gaseous ambient atmosphere at the substrate on the carrier in the process area will determine the current evaporation rate of the suitable treatment liquid, in addition, of course, to the known individual evaporation characteristics of the particular treatment liquid.

If, e.g., on the other hand, the substrate is to be stored in a different unit outside the liquid-treatment unit immediately after the liquid-treatment step, it will be the temperature of the substrate in that different unit and the pressure employed in that different unit, which will determine the evaporation rate of the treatment liquid. Therefore, when speaking of a "desired" temperature of the substrate and a "desired" pressure of the gaseous atmosphere, this may refer to a temperature and pressure of a next processing stage, which may not be measurable yet at the time the parameters of the dispense-pulse sequence are set.

As another example of a "desired" temperature of the substrate, it may in certain circumstance be useful to change the substrate temperature immediately after applying a treatment liquid, without changing the storage position of the substrate, for instance by flash-light illumination. Such temperature increase maybe useful in order to activate a chemical reaction, improve a desired treatment result, or to accelerate the liquid treatment, so that the desired liquid-treatment result is achieved faster than at lower temperature. Similarly, there may be circumstances, in which a liquid treatment is improved under a changed "desired" pressure.

The evaporation rate of a treatment liquid under given or desired temperature and pressure conditions is thus taken into account by the control unit when setting a number of dispense pulses to be applied to the substrate for the liquid treatment, a respective pulse duration of individual dispense pulses, and respective dispense-interruption time spans between the individual dispense pulses. These parameters define a dispense-pulse sequence, which is then applied by virtue of providing valve-control signals, which control the operation of the control valve.

When the control valve opens the liquid communication path between the reservoir and the dispenser in response to a corresponding valve-control signal, dispensing of treatment liquid starts. This is achieved by means well known in the art, which provide a required pressure across the liquid communication path from the reservoir to the dispenser. For instance, a pump can be used. When the control valve shuts the liquid communication path between the reservoir and the dispenser in response to another valve-control signal, dispensing of treatment liquid stops. By timing this operation of the control valve according to the set parameters of a dispense-pulse sequence, liquid-treatment unit of the invention provides a pulsed dispensing of treatment liquid.

The pulsed dispensing of the treatment liquid according to the invention achieves a considerable decrease of the amount of treatment liquid required per substrate over prior-art liquid-treatment units for CMP apparatus. This reduces the processing cost of the CMP stage and the associated costs of chemical waste treatment, and helps reducing the cost of integrated-circuit devices made employing CMP. Alternatively, the processing efficiency may be increased without increasing the costs associated with the chemicals. The invention improves the efficiency of diluted treatment liquid by allowing dilution reduction without increasing the cost. The application of the present invention thus also has an ecological impact by reducing consumption of chemical products.

The liquid-treatment unit can form a separate add-on module. By adding the liquid-treatment unit of the invention, existing treatment apparatus such as CMP apparatus can be improved to reduce the processing cost, like the processing cost of the CMP step.

In a preferred embodiment, the liquid-treatment unit of the invention forms an integral part of a CMP apparatus.

In the following, preferred embodiments of the liquid-treatment unit of the first aspect of the invention will be described. Unless described explicitly as alternatives to each other, the embodiments can be combined with each other.

A preferred embodiment of the liquid-treatment unit of the invention comprises a substrate holder and an associated first monitoring unit, which is connected with the control unit and configured to ascertain presence of a substrate on the substrate holder and to provide a first monitoring signal to the control unit, the first monitoring signal indicating whether or not a substrate is present on the substrate holder, wherein the control unit is adapted to provide a control signal to the control valve instructing the control valve to shut. Preferably, the control unit is adapted to provide a control signal to the control valve instructing the control valve to shut when the monitoring signal indicates that no substrate is present on the substrate holder. This embodiment of the liquid-treatment unit interrupts dispense treatment liquid when no substrate is present on the substrate holder. This way, additional treatment liquid can be saved. The application of a dispense-pulse sequence can be linked to the presence of a substrate on the substrate holder. If no substrate is present, the control valve is shut.

Alternatively, in another embodiment it may be needed to chemically treat the liquid-treatment unit for some reason. For instance, chemical treatment of the liquid-treatment unit may mean that the station is to be kept wet to prevent it from drying, or it may mean that a cleaning chemical is used to remove slurry and other particles from the station. In this case a pulsed application of the chemicals to the station may also be used. The present embodiment may involve dispensing another liquid than the previous, alternative embodiment.

In order to combine both before-mentioned alternative embodiments, additional sensor means should be provided that allow to differentiate between a case, in which the dispense of liquid should be stopped or started/continued.

In a further embodiment of the liquid-treatment unit of the invention, a substrate holder and a second monitoring unit are provided. The second monitoring unit is connected with the control unit and configured to detect a removal of a substrate from the substrate holder and to provide a second monitoring signal to the control unit indicating that a substrate has been removed from the substrate holder. This embodiment forms a basis for several useful applications, which each form individual embodiments of the liquid-treatment unit. The presence or absence of the wafer activates or deactivates, respectively, the liquid treatment. An initial dispense pulse can be applied as soon as a wafer is detected. The subsequent pulse sequence can be determined by the control unit according to the current temperature and pressure conditions and the properties of the treatment liquid or the wafer. Preferably, the liquid-treatment unit comprises a temperature sensor, which is configured to provide a temperature signal indicative of the substrate temperature. Preferably, a pressure sensor is also comprised by the liquid-treatment unit and configured to provide a pressure signal to the control unit, indicative of the pressure of the gaseous atmosphere adjacent to the substrate holder. This enables an embodiment, in which the control unit is adapted to. Monitoring incoming temperature and/or pressure signals and to adjust the said number of dispense pulses to be applied to the substrate for the liquid treatment, the respective pulse duration of the individual dispense pulses and/or respective dispense-interruption time spans between the individual dispense pulses. This way, the delivered amount of treatment liquid and the characteristics of a dispense-pulse sequence can be adapted to varying temperature and pressure conditions.

If multiple treatment liquids are required, multiple dispensers may not be feasible due to physical restrictions, for instance in a given CMP apparatus. An alternative solution that forms a preferred embodiment of the liquid-treatment unit of the invention comprises a multitude of reservoirs, each for respective different treatment liquid, and a corresponding multitude of control valves, each having a control input port and being arranged in a respective liquid-communication path between the respective reservoir and the output port of the spray dispenser, and which is adapted to open or shut the respective liquid-communication path according to valve-control signals received at the control input port, wherein the control unit is additionally configured to generate and provide respective valve-control signals for each control valve. Using this multiple-control-valve system a substrate surface can be treated with multiple treatment liquids or different chemicals can be used on various substrates, which need specific chemical treatment.

The treatment liquids can also be applied simultaneously. A further preferred embodiment therefore comprises a mixing unit that is interconnected in liquid communication paths between a multitude of reservoirs on one side and the dispenser on the other side, and which is adapted to provide to the dispenser a homogeneous mix of incoming treatment liquids according to a predetermined mixing ratio.

A particularity of most CMP tools is that they use multiple wafer processing carriers. A preferred embodiment thus comprises carrier unit with a plurality of carriers, which are configured to hold a corresponding plurality of substrates and to successively expose individual ones of the substrates to liquid treatment.

However, situations may occur, in which one or more CMP carriers are not loaded with a substrate. For example, instead of a full capacity of N substrates, only N−1 substrates are provided. That means that only N−1 carriers are active, i.e., are actually working or, in other words, operational. The present embodiment of the liquid-treatment unit includes a second monitoring unit, which is connected with the control unit. The second monitoring unit is configured to detect the number of active carriers and to generate and provide a second monitoring signal indicative of the number of active carriers. The control unit of this embodiment is adapted to generate and provide the sequence of valve-control signals to the control valve for each active carrier, that is, to adapt the sequence to a time delay of a substrate on an active carrier in the input station. This way, treatment liquid will be provided with different sequences depending on the number of active carriers.

The present embodiment of the liquid-treatment unit of the invention thus helps to further save treatment liquid, and thus processing cost.

Yet another solution to saving treatment liquid is to collect used treatment liquid that may be use again. A further preferred embodiment of the liquid-treatment unit of the invention therefore comprises a treatment-collection unit, which has a collection vessel arranged and configured to collect used treatment liquid underneath a treatment position of the substrate holder. Typically, treatment liquid will be contaminated after a first use. It is therefore advantageous to include a cleaning unit, which is in liquid communication with the collection vessel and configured to filtered and/or decontaminate the collected treatment liquid.

An output of the cleaning unit is preferably connected with the reservoir.

The preferred way for dispensing the liquid is in the form of a spray. The dispenser is therefore preferably configured to output the treatment liquid in the form of a spray.

According to a second aspect of the present invention, a chemical-mechanical planarization apparatus, also referred to in short as CMP apparatus or CMP tool, is provided that comprises a liquid-treatment unit according the first aspect of the invention or according to one of the embodiments of the liquid-treatment unit described herein.

The liquid-treatment unit can be part of an input unit of the CMP apparatus that serves for a pre-CMP treatment of substrates. A liquid-treatment unit according to the invention can additionally or alternatively be provided for post-CMP treatment of the substrates, for instance in an output station of the CMP apparatus of the invention, or for after post-CMP cleaning. A further advantageous embodiment of the CMP apparatus additionally or alternatively comprises a liquid-treatment unit integrated into a CMP process area. This embodiment is useful for cases of interruption of the CMP treatment in order to keep the currently processed substrates wet and thus avoid damages to the substrate due to drying up.

According to a third aspect of the invention, a method for liquid treatment of a substrate is provided, comprising a step of dispensing a treatment liquid onto the substrate surface for achieving a desired liquid-treatment result.

The method of the invention comprises, before the dispensing step, a step of setting, in dependence on an evaporation rate of the treatment liquid on the substrate at the given or desired temperature of the substrate and/or at the given or desired pressure of the gaseous atmosphere, a number of dispense pulses to be applied to the substrate during the dispense step, a respective pulse duration of individual dispense pulses, and respective dispense interruption time spans between the individual dispense pulses.

The dispensing step of the method of the invention comprises applying a dispense-pulse sequence that has the set number of dispense pulses, the set respective pulse durations, and the set respective dispense interruption time spans between the individual dispense pulses.

The advantageous of the liquid-treatment method of the invention correspond to those described earlier in the context of the liquid-treatment unit of the first aspect of the invention and the CMP apparatus of the second aspect of the invention.

In the following, some preferred embodiments of the method of the invention will be described, which do not directly correspond to preferred embodiments of the liquid-treatment unit of the first aspect of the invention. Unless described explicitly as alternatives to each other, the embodiments can be combined with each other.

A preferred embodiment of the method of the invention comprises a step of measuring the substrate temperature or the pressure of the gaseous atmosphere adjacent to the substrate, or both quantities before the setting step. Measuring the substrate temperature can be performed by measuring any quantity that is indicative of the substrate temperature. For instance, the temperature of the gaseous ambient atmosphere adjacent to the substrate is usually also indicative of the substrate temperature, if the substrate has been stored in the gaseous atmosphere for a sufficient time span.

Exact knowledge of the evaporation rate allows precisely assessing the amount of treatment liquid required. The evaporation rate can be determined directly by measurement or monitoring, for instance by employing an evaporation sensor (evaporometer), or by calculation on the basis of temperature and pressure parameters. Note that in case the temperature and/or pressure can be deduced from other parameters or preset conditions, it will not be necessary to separately measure the respective quantity. In that case, the known temperature and/or pressure value can be used for setting the parameters of a dispense-pulse sequence.

A further preferred embodiment comprises a step of maintaining a temperature of the treatment liquid at a desired temperature value before the dispensing step. Controlling the temperature of the treatment liquid allows controlling chemical reaction parameters of the liquid treatment. By heating the treatment liquid to a desired temperature, the reaction speed may for instance be increased, thus decreasing the processing time for the liquid treatment and increasing the substrate throughput.

A further embodiment comprises, before the setting step, a step of ascertaining a treatment-liquid amount, which is required to achieve a desired processing result of the liquid-treatment step, in dependence on an evaporation rate of the treatment liquid on the substrate at a given or desired temperature of the substrate and at a given or desired pressure of a gaseous atmosphere, in which the substrate is stored during or after the liquid-treatment step. This embodiment enables an automated adjustment of suitable parameters of a dispense-pulse sequence and reduce the necessity to preprogram required treatment-liquid amounts and their dependents on temperature and pressure.

According to a fourth aspect of the invention or one of its embodiments, a chemical-mechanical planarization method is provided that comprises the method for liquid treatment of the third aspect for the invention before or after a chemical-mechanical planarization step.

In the following, further preferred embodiments of the invention will be described with reference to the enclosed figures.

FIG. 1 shows a schematic diagram of a liquid-treatment unit 100 for use in a CMP apparatus. The view is simplified to block diagram, which only shows those elements of the liquid treatment unit 100, which are necessary to illustrate the invention.

Figure 1:
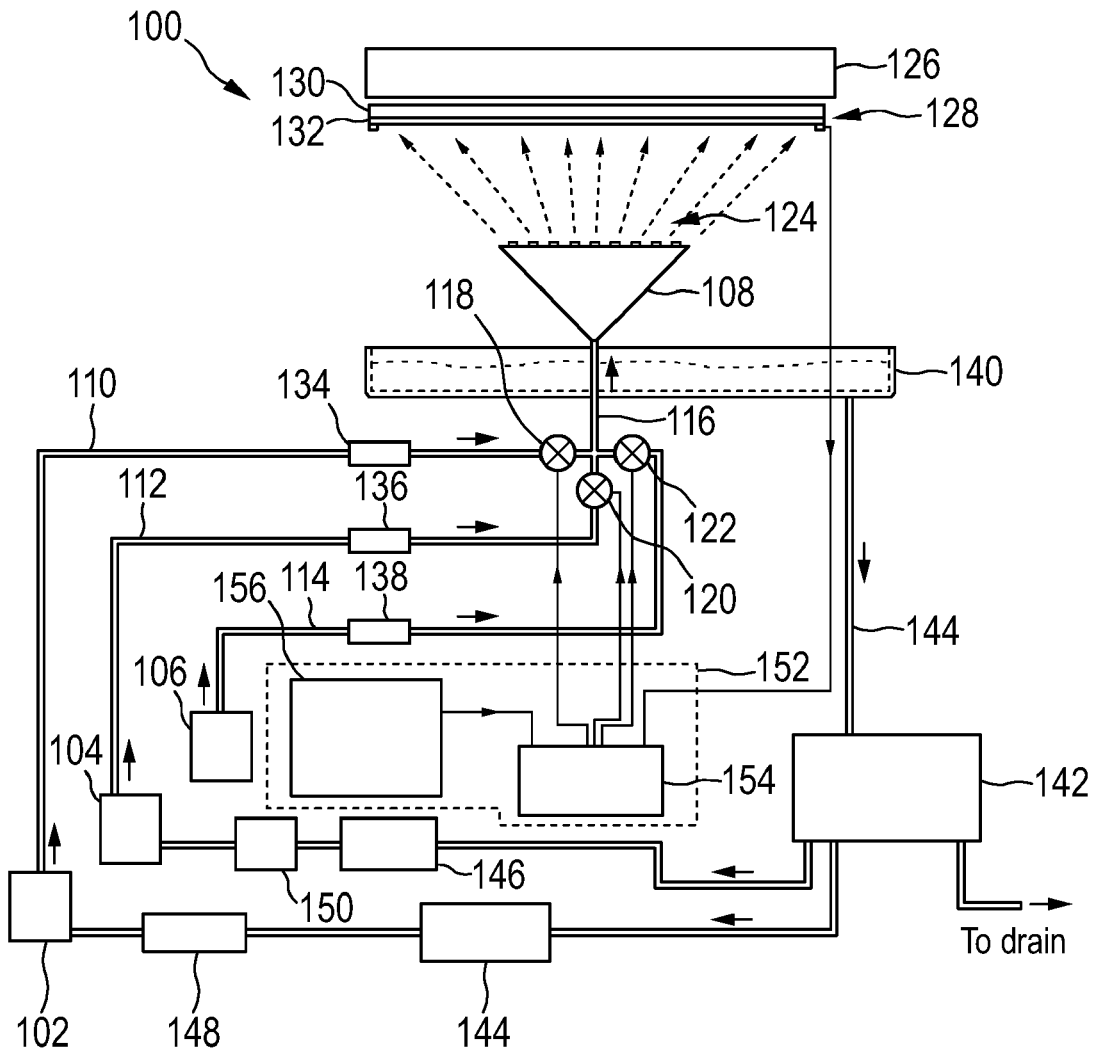
FIG. 1 shows a schematic view of a liquid-treatment unit according to a preferred embodiment of the invention.

The liquid-treatment unit comprises a set of reservoirs for treatment liquids, three of which are shown in FIG. 1 under reference labels 102, 104, and 106. It is understood that, depending on the particular application, the set of reservoirs for treatment liquids may contain any useful number of individual reservoirs. For illustrative purposes, it will be assumed that reservoirs 102 and 104 contain liquid treatment chemicals, which will be referred to as chemical #1 and chemical #2 hereinafter. Furthermore, it will be assumed that reservoir 106 contains deionized (DI) water.

Reservoirs 102 to 106 are connected with a dispenser in the form of a shower cone by means of respective conduits 110, 112, 114, and 116. Control valves 118, 120, and 122 are interconnected in the liquid communication path between the respective reservoirs 102, 104 and 106 and the dispenser 108. The common conduit 116 is arranged behind the valves 118 to 122 in the liquid communication path between the reservoirs 102 to 106 and dispenser 108.

As mentioned above, the dispenser 108 is a shower cone. It provides a liquid spray through a plurality of nozzles 124. The nozzles are arranged facing upwards towards a substrate holder 126, to which a wafer 128 comprising a silicon substrate 130 with an interconnect stack 132 deposited thereon. In addition or as an alternative to an upward-facing cone, other arrangements can, of course, be envisaged. A variety of dispensing arrangements is known to the person of average skill in the art.

Flow meters 134, 136, and 138 arranged between reservoirs 102, 104, and 106 and respective control valves 118, 120, and 122 and allow to monitor the amount of liquid flowing through the conduit cross sectional area per unit time. Control means may be provided to set the flow, but are not shown here.

A treatment-liquid collection unit 140 in the form of a vessel, which is open towards the liquid-treatment zone above the dispenser 108 serves to collect all used treatment liquids, which drop off the wafer 128 or parts of the liquid treatment unit. The treatment-liquid collection unit 140 is connected to a multiport segregation device 142 by a drain conduit 144. Multiport segregation device 142 serves to separate chemicals #1 and #2 from the used treatment liquid and to forward the separated liquids to respective filtration devices 144 and 146, followed by respective ionic decontamination devices 148 and 150. The outputs of the ionic decontamination devices 148 and 150 are respectively connected with inputs of reservoirs 102 and 104 for chemicals #1 and #2. Multiport segregation device 142 further contains an output to a drain (not shown) for collecting liquid waste, which cannot be recirculated.

Control valves 118 to 122 have control input ports, which are connected for signal reception (or signal exchange, such as handshake) with a control unit 152. The control unit comprises a time switch 154, which directly communicates with the control valves 118 to 122 by generating and providing a sequence of valve-control signals for opening and shutting the control valves according a dispense-pulse sequence, which is calculated by a processor 156.

Figure 2:
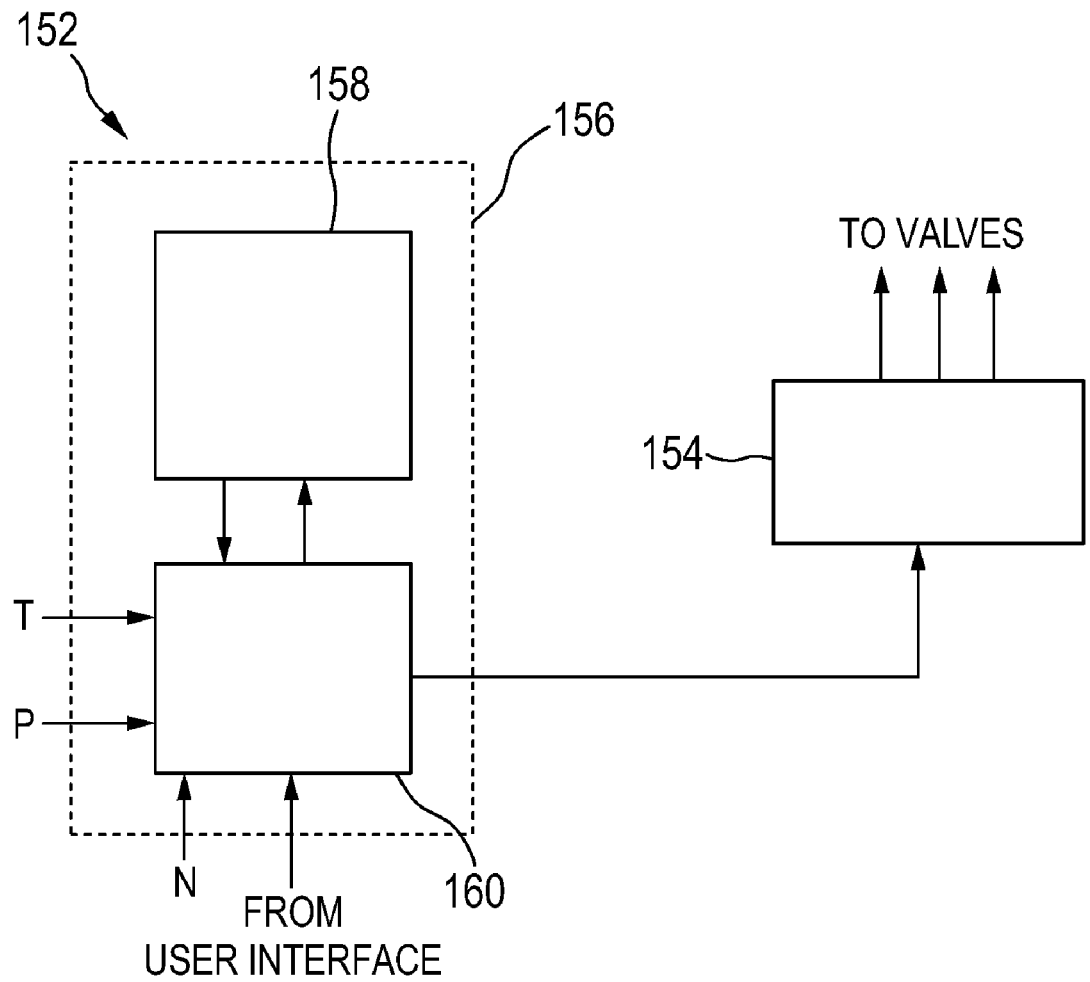
FIG. 2 shows a block diagram illustrating a preferred embodiment of the control unit of the liquid-treatment unit of FIG. 1.

A more detailed structure of the control unit 152 is given in the block diagram FIG. 2. The following description will refer to FIGS. 1 and 2 in parallel.

The processor 156 comprises a memory 158 and a processor 160. The memory 158 stores data, which aid in the calculation of dispense-pulse sequences. For instance, a pre-calculated dispense pulse sequence can be stored in memory 158 in the form of a parameter set defining the number of pulses, the individual dispense-pulse durations and interruption time spans between individual dispense pulses. Memory 158 may be organized for this purpose in the form of a lookup table, which assigns a specific set of dispense-pulse sequence parameters to a given set of temperature and pressure values.

In one embodiment the memory additionally contains lookup tables for different individual treatment liquids, and for different individual treatment purposes. Furthermore, memory 158 may contain executable program code that is configured to calculate an evaporation rate of a given liquid in dependence on temperature and pressure and to determine a required treatment-liquid amount.

Processor 160 is adapted to access the look-up tables in the memory 158 in order to retrieve a parameter set of a suitable dispense-pulse sequence, and to execute the program code stored in the memory 158. Processor 160 receives, typically not directly, but by means of a converter device, various monitoring signals as input parameters, which are indicative of the current temperature T, the current pressure P and a number N of CMP apparatus carriers available. Furthermore, processing unit 160 is connected to a user interface for optionally receiving instructions from an operator of the liquid-treatment unit 100. On the basis of such given input parameters, processor 160 determines an appropriate dispense-pulse sequence, by accessing a suitable lookup table in memory 158 and/or executing the mentioned program code. The retrieved and/or calculated parameter values of an appropriate dispense-pulse sequence are fed to the time switch 154, which generates suitable valve-control signals for opening and shutting control valves 118 to 120 at the determined points in time for generating the dispense pulse sequence.

Note that individual applications may not require to take account of a current ambient pressure because the ambient pressure is fixed to a known value. Similarly, the temperature may be fixed so that in that case a measurement of the substrate temperature is not required. Such circumstances will accelerate the look up of suitable dispense pulse sequences. However, where temperature may change, it is advantageous to measure it in order to be able to adjust the parameters of a dispense-pulse sequence to the changing temperature. For instance, if temperature is increased during a cleaning step, the duration of following spray pulses can be increased to provide a larger amount of liquid that takes account of an increased evaporation rate at the alleviated temperature.

Figure 3:
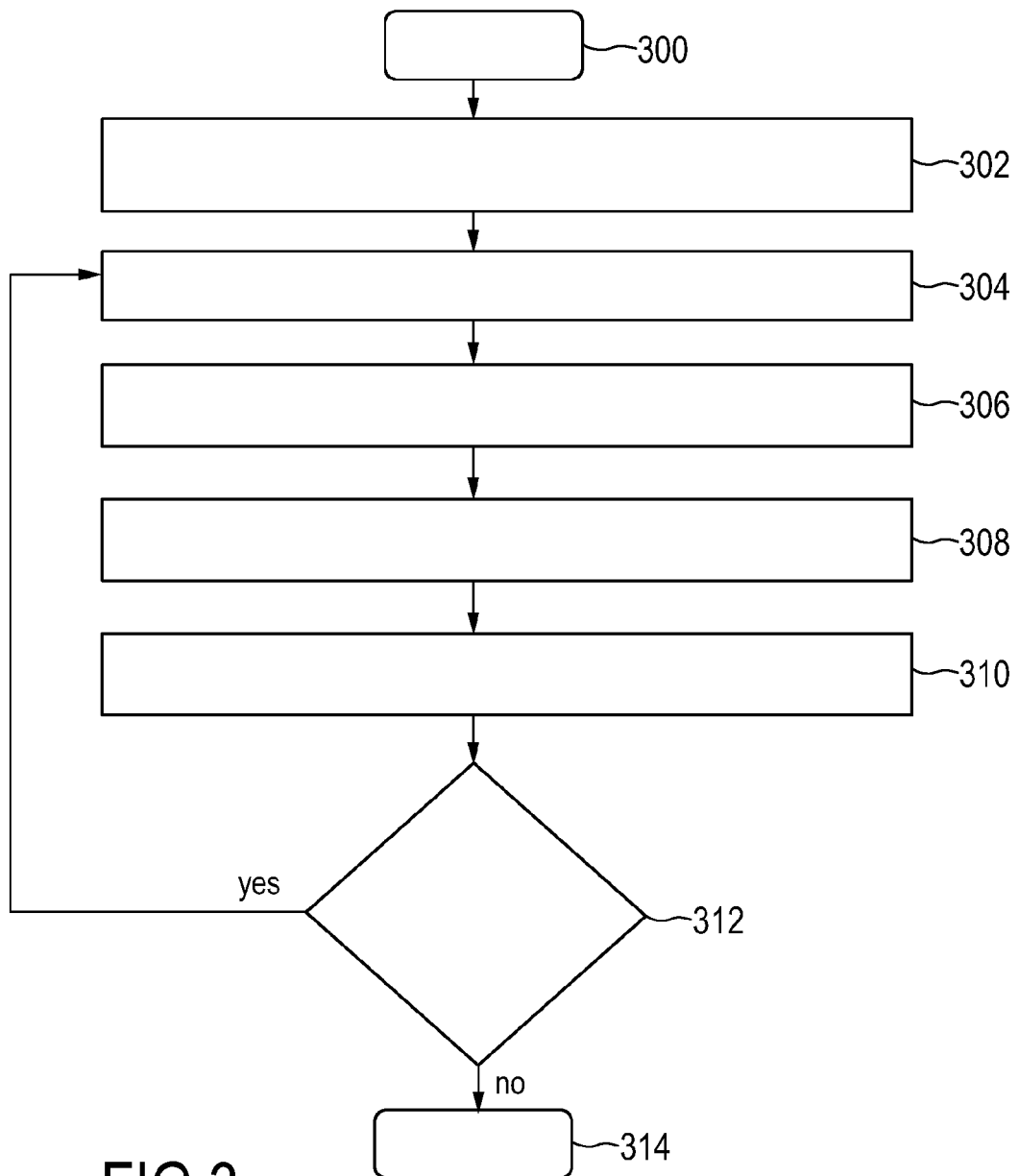
FIG. 3 shows a flow diagram of an embodiment of a control method employed in the control unit of FIG. 2.

FIG. 3 is block diagram of a liquid-treatment method according to the invention. The text corresponding to the various boxes is provided in Table 1.

TABLE 1

| Ref. numeral | Text |
| --- | --- |
| 300 | Start |
| 302 | Start monitoring temperature and pressure |
| 304 | Count number of active carriers |
| 306 | Set spray-pulse sequence per substrate |
| 308 | Set total spray-pulse sequence for all substrates in batch |
| 310 | Generate and provide control signals to control valve |
| 312 | Next batch ? |
| 314 | End |

The method is started at a step 300. At a step 302, monitoring of temperature and pressure is started. In the following step 304, the number of active CMP apparatus carriers is counted. Then, a suitable spray-pulse sequence per substrate is ascertained and set in step 306, using the number of carriers available and the number of active carriers. The total spray-pulse sequence for all active carriers is set in step 308. Subsequently, valve-control signals are generated and provided to all control valves, which are required for the desired liquid treatment (step 310). In a next step 312, it is ascertained whether a next quantity of substrates to be treated is present at an input stage. If yes, the processing branches back to step 304 or 302 to determine the number of working carriers. If no more substrates are to be processed, the method ends with step 314.

Figure 4:
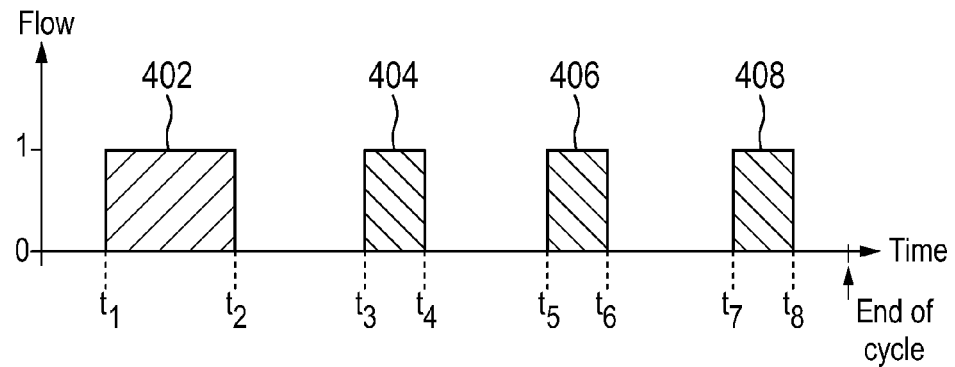
FIGS. 4 and 5 show illustrative examples of dispense-pulse sequences generated for liquid treatment of a substrate before or after a chemical-mechanical planarization step.

FIG. 4 shows a time diagram of an illustrative example of a spray-pulse sequence to be applied to a single substrate. The abscissa shows the time in arbitrary units, and the ordinate shows the liquid flow as measured at one of the flow meters 134 to 138 in arbitrary linear units. A first pulse of chemicals 402 is applied between $t_1$ and $t_2$ after a wafer has been loaded to the liquid treatment unit 100. After an interruption-time-span $t_3-t_2$, a second spray pulse 404 is applied, having a duration of $t_4-t_3$. Two further spray pulses 406 and 408 are generated between $t_5$ and $t_6$, and between $t_7$ and $t_8$, thus finishing the liquid treatment cycle of FIG. 4. Note that the first spray pulse 402 extends over a longer time span $t_2-t_1$ then the consecutive spray pulses 404, 406, and 408. This sort of spray pulse sequence is useful for example in the creation of an initial surface passivation layer, where a larger volume of chemical is typically necessary to insure the complete passivation of the surface, with respect to the total volume of the chemical, which is required to sustain the passivation layer. Therefore, the duration of the first spray-pulse 402 is longer than that of the subsequent pulses, in order to provide a larger volume of the required treatment liquid.

Figure 5:
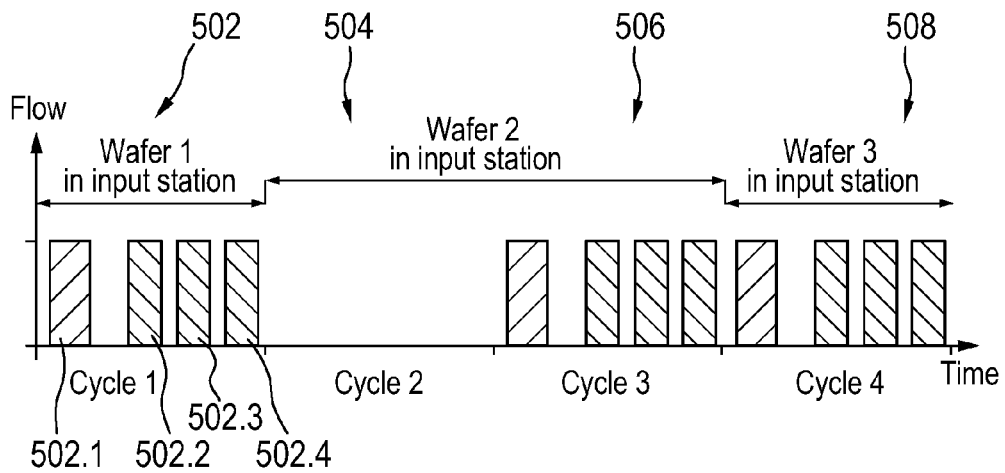

FIG. 5 shows a further illustrative example of a spray-pulse sequence. The spray-pulse sequence is illustrated again in the form of a time diagram with the same axes as in FIG. 4. The illustrative example of FIG. 5 reflects a case where a total of three wafers is processed in a liquid-treatment unit and loaded onto a CMP tool which provides room for 4 substrates, i.e. 4 carriers. For the purpose of the present illustrative example, it is assumed that the second carrier of the CMP tool is not active. This situation can be accounted for by performing only the number of spray-pulse sequences that corresponds to the detected number of active carriers. In the present case, a second spray-pulse sequence, which would be performed in the presence of a complete set of 4 wafers is set off. Processing is only resumed after the time duration of the second spray-pulse sequence.

The previous description illustrates the advantages of a controlled pulsed liquid-treatment dispense system according to the invention. In particular, the amount of treatment liquid, which is used during the liquid treatment, is considerably reduced over previous solutions.

Variations to the embodiments described herein are possible. For instance, temperature and/or pressure measurements may not be needed for all pulses or pulse sequences. The required sequences may be experimentally determined at worst-case temperature and pressure values, preprogrammed, and carried out without actual reference to the current or desired conditions.

When interpreting the present description and its associated claims, expressions such as "comprise", "include", "incorporate", "contain", "is", and "have" are to be construed in a non-exclusive manner, namely construed to allow for other items or components, which are not explicitly defined also to be present. Reference to the singular is also to be construed in be a reference to the plural and vice versa.

Furthermore, the invention may also be embodied with less components than provided in the embodiments described here, wherein one component carries out multiple functions. Just as well may the invention be embodied using more elements than depicted in the Figures, wherein functions carried out by one component in the embodiment provided are distributed over multiple components.

A person skilled in the art will readily appreciate that various parameters disclosed in the description may be modified and that various embodiments disclosed and/or claimed may be combined without departing from the scope of the invention.

It is stipulated that the reference signs in the claims do not limit the scope of the claims, but are merely inserted to enhance the legibility of the claims.

The invention claimed is:

1. A liquid-treatment unit for treating a substrate, comprising
a dispenser, having an input port and an output port and which is configured to dispense a treatment liquid received at the input port onto a substrate;
a control valve, coupled in a liquid-communication path between a source of the treatment liquid and the output port of the dispenser, and which is adapted to open or shut the liquid-communication path according to valve-control signals received at a control input port of the control valve; and
a control unit, connected to the control valve, and which is adapted to set, in dependence on an evaporation rate of the treatment liquid on the substrate at a given or desired temperature of the substrate or at a given or desired pressure of a gaseous ambient atmosphere at the substrate, a number of dispense pulses to be applied to the substrate for the liquid treatment, a respective pulse duration of individual dispense pulses, and respective dispense-interruption time spans between the individual dispense pulses, and generate and provide a sequence of valve-control signals to the control valve for opening and shutting the liquid communication path according to a dispense-pulse sequence with the set number of dispense pulses, the set respective dispense-pulse durations, and the set respective dispense-interruption time spans between individual dispense pulses.

2. The liquid-treatment unit of claim 1, comprising a substrate holder and an associated first monitoring unit, which is connected with the control unit and configured to ascertain presence of a substrate on the substrate holder and to provide a first monitoring signal to the control unit, the first monitoring signal indicating whether or not a substrate is present on the substrate holder, wherein the control unit is adapted to provide a control signal to the control valve instructing the control valve to shut, or, in the alternative, to open in response to the monitoring signal indicating that no substrate is present on the substrate holder.

3. The liquid-treatment unit of claim 2, comprising a treatment-liquid collection unit, that has a collection vessel arranged and configured to collect used treatment liquid underneath a treatment position of the substrate holder.

4. The liquid-treatment unit of claim 3, further comprising a cleaning unit, which is in liquid-communication with the collection vessel and configured to filtrate and decontaminate the collected treatment liquid.

5. The liquid-treatment unit of claim 1, wherein:
the dispenser is configured to dispense a multitude of additional treatment liquids;
the liquid-treatment unit further includes, for each respective one of the multitude of additional treatment liquids, a respective control valve arranged in a respective liquid-communication path between a respective source of the additional treatment liquid and the output port of the dispenser, the respective control valve configured to open or shut the respective liquid-communication path according to valve-control signals received at a control input port of the respective control valve; and wherein the control unit is additionally configured to generate and provide respective valve-control signals for each respective control valve corresponding to the multitude of additional treatment liquids.

6. The liquid-treatment unit of claim 5, comprising a mixing unit coupled to the liquid communication paths to receive the treatment liquid and multitude of additional treatment liquids, and which is adapted to provide to the dispenser a homogeneous mix of treatment liquids received by the mixing unit according to a predetermined mixing ratio.

7. The liquid-treatment unit of claim 1, comprising a second monitoring unit, which is associated with a carrier unit of a CMP apparatus that comprises a plurality of carriers, which are configured to hold a plurality of substrates and to successively expose individual ones of the substrates to liquid treatment, the second monitoring unit being connected with the control unit and configured to count a number of active CMP apparatus carriers, and to generate and provide a second monitoring signal indicative of the number of active CMP apparatus carriers, wherein the control unit is adapted to generate and provide the sequence of valve-control signals to the control valve for each substrate according to the counted number of operational CMP apparatus carriers.

8. The liquid-treatment unit of claim 1, wherein the dispenser is adapted to output the treatment liquid in the form of a spray.

9. A Chemical-Mechanical Planarization apparatus or post-CMP substrate cleaning apparatus, comprising a liquid-treatment unit according to claim 1.

10. A method for liquid treatment of a substrate, comprising a step of dispensing a treatment liquid onto a substrate surface for achieving a desired liquid-treatment result, comprising, before the dispensing step, a step of setting, in dependence on an evaporation rate of the treatment liquid on the substrate at a given or desired temperature of the substrate or at a given or desired pressure of a gaseous ambient atmosphere at the substrate, a number of dispense pulses to be applied to the substrate during the dispense step, a respective pulse duration of individual dispense pulses, and respective dispense interruption time spans between the individual dispense pulses;

wherein the dispensing step comprises:

applying a dispense-pulse sequence that has the set number of dispense pulses, the set respective pulse durations, and the set respective dispense interruption time spans between the individual dispense pulses.

11. The method of claim 10, comprising a step of measuring at least one of the evaporation rates of the treatment liquids, the substrate temperature and the pressure of the gaseous ambient atmosphere before the setting step.

12. The method of claim 10, comprising a step of maintaining a temperature of the treatment liquid at a desired temperature value before the dispensing step.

13. The method of claim 10, comprising, before the step of applying the dispense-pulse sequence, a first step of monitoring a substrate holder for a presence of a substrate on the substrate holder, wherein the dispense-pulse sequence is not applied if no substrate is detected on the substrate holder.

14. The method of claim 10, comprising a step of collecting used treatment liquid after the dispensing step.

15. The method of claim 10, comprising a step of recirculating the collected used treatment liquid.

16. The method of claim 10, comprising a step of cleaning the collected used treatment liquid.

17. The method of claim 10, wherein at least two partial treatment liquids are merged before the spraying step to form the dispensed treatment liquid.

18. The method of claim 10, wherein the step of dispensing the treatment liquid comprises spraying the treatment liquid onto the substrate surface.

19. The method of claim 10, further comprising, before the setting step, a step of ascertaining a treatment-liquid amount, which is required to achieve a desired processing result of a respective dispense pulse, in dependence on an evaporation rate of the treatment liquid on the substrate at a given or desired temperature of the substrate and at a given or desired pressure of a gaseous atmosphere, in which the substrate is stored during or after the liquid-treatment step.

20. The method of claim 10, which is used for liquid treatment of a substrate before, during or after either a chemical-mechanical planarization method or a post-chemical-mechanical-planarization cleaning method.

* * * * *